United States Patent
Nitta et al.

(10) Patent No.: US 12,177,977 B2
(45) Date of Patent: Dec. 24, 2024

(54) FLEXIBLE PRINTED CIRCUIT BOARD AND METHOD OF MANUFACTURING FLEXIBLE PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Koji Nitta, Osaka (JP); Yasushi Mochida, Osaka (JP); Yoshio Oka, Osaka (JP); Shoichiro Sakai, Osaka (JP); Tadahiro Kaibuki, Osaka (JP); Junichi Okaue, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 18/297,857

(22) Filed: Apr. 10, 2023

(65) Prior Publication Data
US 2023/0247763 A1  Aug. 3, 2023

Related U.S. Application Data

(62) Division of application No. 17/126,306, filed on Dec. 18, 2020, now Pat. No. 11,696,401.

(30) Foreign Application Priority Data

Jan. 10, 2020 (JP) .................. 2020-003238

(51) Int. Cl.
*H05K 1/02* (2006.01)
*H05K 1/11* (2006.01)
(Continued)

(52) U.S. Cl.
CPC .......... *H05K 1/118* (2013.01); *H05K 1/0265* (2013.01); *H05K 1/0298* (2013.01); *H05K 3/241* (2013.01);
(Continued)

(58) Field of Classification Search
CPC .... H05K 1/118; H05K 1/0265; H05K 1/0298; H05K 3/241; H05K 3/361;
(Continued)

(56) References Cited

U.S. PATENT DOCUMENTS 4,490,690 A    12/1984  Suzuki
5,134,460 A *   7/1992  Brady ............... H01L 24/13
                                           257/737
(Continued)

FOREIGN PATENT DOCUMENTS

JP     H02-109390    4/1990
JP     H10-032201    2/1998
(Continued)

*Primary Examiner* — Steven T Sawyer
(74) *Attorney, Agent, or Firm* — IPUSA, PLLC

(57) ABSTRACT

A flexible printed circuit board includes a base film having an insulating property and a plurality of interconnects laminated to at least one surface side of the base film. The plurality of interconnects includes a first interconnect and a second interconnect in a same plane. An average thickness of the second interconnect being greater than an average thickness of the first interconnect. A ratio of the average thickness of the second interconnect to the average thickness of the first interconnect is greater than or equal to 1.5 and less than or equal to 50. The first interconnect includes a first conductive underlayer and a first plating layer, and the second interconnect includes a second conductive underlayer, a second plating layer, and a third plating layer.

8 Claims, 4 Drawing Sheets

(51) Int. Cl.
*H05K 3/24* (2006.01)
*H05K 3/36* (2006.01)

(52) U.S. Cl.
CPC ..... *H05K 3/361* (2013.01); *H05K 2201/0338* (2013.01); *H05K 2201/09236* (2013.01); *H05K 2201/094* (2013.01); *H05K 2201/09736* (2013.01); *H05K 2203/0723* (2013.01)

(58) Field of Classification Search
CPC . H05K 2201/0338; H05K 2201/09236; H05K 2201/094; H05K 2201/09736; H05K 2203/0723; H05K 1/0393; H05K 3/108; H05K 2203/1476; H05K 3/244; H05K 2201/0341; H05K 2201/0347
See application file for complete search history.

(56) References Cited

U.S. PATENT DOCUMENTS

| | | | |
|---|---|---|---|
| 5,545,927 A | 8/1996 | Farooq et al. | |
| 9,806,011 B2 | 10/2017 | Zhang et al. | |
| 10,548,217 B1 | 1/2020 | Takahashi et al. | |
| 2001/0016407 A1 | 8/2001 | Schoenfeld et al. | |
| 2002/0022385 A1 | 2/2002 | Miyake et al. | |
| 2004/0036833 A1 | 2/2004 | Monzen | |
| 2005/0039945 A1 | 2/2005 | Matsuda et al. | |
| 2007/0007665 A1 | 1/2007 | Clevenger et al. | |
| 2007/0111401 A1 | 5/2007 | Kataoka et al. | |
| 2007/0145584 A1 | 6/2007 | Kataoka et al. | |
| 2008/0236872 A1* | 10/2008 | Kataoka | H05K 3/06 29/829 |
| 2012/0031648 A1 | 2/2012 | Ebe | |
| 2015/0053470 A1 | 2/2015 | Kawai | |
| 2019/0393143 A1 | 12/2019 | Rosch et al. | |
| 2020/0022262 A1* | 1/2020 | Okamoto | H05K 3/244 |
| 2020/0214128 A1 | 7/2020 | Wu et al. | |
| 2021/0212208 A1 | 7/2021 | Shibata et al. | |
| 2023/0007783 A1* | 1/2023 | Ito | H05K 3/064 |

FOREIGN PATENT DOCUMENTS

| | | |
|---|---|---|
| JP | 2018-195681 | 12/2018 |
| JP | 2019-212349 | 12/2019 |
| WO | 2018/211733 | 11/2018 |
| WO | 2019/230332 | 12/2019 |

* cited by examiner

FLEXIBLE PRINTED CIRCUIT BOARD AND METHOD OF MANUFACTURING FLEXIBLE PRINTED CIRCUIT BOARD

CROSS-REFERENCE TO RELATED APPLICATIONS

This application is a divisional of U.S. patent application Ser. No. 17/126,306 filed on Dec. 18, 2020, which is based upon and claims priority to Japanese Patent Application No. 2020-003238 filed on Jan. 10, 2020, the entire contents of which are incorporated herein by reference.

BACKGROUND OF THE INVENTION

1. Field of the Invention

The present disclosure relates to a flexible printed circuit board and a method of manufacturing the flexible printed circuit board.

2. Description of the Related Art

Flexible printed circuit boards are widely used to constitute circuitry of various electronic devices. As the size of electronic devices has been reduced in recent years, the size of flexible printed circuit boards is significantly reduced and the density of interconnects of a flexible printed circuit board significantly increases.

As such a small flexible printed circuit board, a flexible printed circuit board including a sheet-like insulating substrate and interconnects laminated to a surface of the substrate by plating has been proposed (see Patent Document 1). In this flexible printed circuit board, the thickness of the plating film, that is, the thickness of the interconnects is made uniform.

Here, in a flexible printed circuit board, signal lines, current lines, and the like may be provided as interconnects. For example, when a flexible printed circuit board includes a current line and a signal line, it is desirable that an electrical resistance of the current line is lower than an electrical resistance of the signal line, because it is desirable for as much current to be flowed as possible in the current line.

With respect to the above, as described above, space-savings are desired for a flexible printed circuit board for which size reduction is desired.

Thus, when the flexible printed circuit board includes multiple current lines, it is desirable that the line width is small in an entirety of interconnects, that is, space-savings are desirable, while reducing the electrical resistance of the current lines in the entirety of interconnects.

Therefore, it is desirable to provide a flexible printed circuit board that can reduce the electrical resistance of the entirety of interconnects and can achieve space-savings, and to provide a method of manufacturing the flexible printed circuit board.

RELATED-ART DOCUMENTS

Patent Documents

Patent Document 1: Japanese Laid-Open Patent Publication No. 2018-195681

SUMMARY OF THE INVENTION

According to one aspect of the embodiments of the present disclosure, a flexible printed circuit board includes a base film having an insulating property, and multiple interconnects laminated to at least one surface side of the base film. The multiple interconnects include a first interconnect and a second interconnect in a same plane. An average thickness of the second interconnect is greater than an average thickness of the first interconnect. A ratio of the average thickness of the second interconnect to the average thickness of the first interconnect is greater than or equal to 1.5 and less than or equal to 50.

According to another aspect of the embodiments of the present disclosure, with respect to a method of manufacturing a flexible printed circuit board including a base film having an insulating property and multiple interconnects laminated to at least one surface side of the base film, wherein the multiple interconnects include a first interconnect and a second interconnect in a same plane, an average thickness of the second interconnect being greater than an average thickness of the first interconnect, and wherein a ratio of the average thickness of the second interconnect to the average thickness of the first interconnect is greater than or equal to 1.5 and less than or equal to 50, the method includes forming one or more first plating bodies and one or more second plating bodies by electroplating a first metallic material on a conductive underlayer of the base film by using a first resist pattern, the conductive underlayer being laminated to at least one surface side of the base film, removing the first resist pattern and non-laminated regions of the conductive underlayer where the one or more first plating bodies and the one or more second plating bodies are not laminated after the forming one or more first plating bodies and one or more second plating bodies, forming one or more third plating bodies by electroplating a second metallic material on the one or more second plating bodies by using a second resist pattern after the removing the first resist pattern and non-laminated regions of the conductive underlayer, and removing the second resist pattern after the forming one or more third plating bodies, so that the first interconnect is formed as a first laminated structure including the conductive underlayer and a corresponding one of the one or more first plating bodies, and the second interconnect is formed as a second laminated structure including the conductive underlayer, a corresponding one of the one or more second plating bodies, and a corresponding one of the one or more third plating bodies.

According to another aspect of the embodiments of the present disclosure, with respect to a method of manufacturing a flexible printed circuit board including a base film having an insulating property and a plurality of interconnects laminated to at least one surface side of the base film, wherein the plurality of interconnects includes a first interconnect and a second interconnect in a same plane, an average thickness of the second interconnect being greater than an average thickness of the first interconnect, and wherein a ratio of the average thickness of the second interconnect to the average thickness of the first interconnect is greater than or equal to 1.5 and less than or equal to 50, the method includes forming one or more fourth plating bodies by electroplating a third metallic material on a conductive underlayer of the base film by using a third resist pattern, the conductive underlayer being laminated to at least one surface side of the base film, removing the third resist pattern after the forming one or more fourth plating bodies, forming one or more fifth plating bodies by electroplating a fourth metallic material on non-laminated regions of the conductive underlayer where the one or more fourth plating bodies are not laminated by using a fourth resist pattern after the removing the third resist pattern, an average thickness of the one or more fifth plating bodies being greater than an average thickness of the one or more fourth plating bodies, and removing the fourth resist pattern and non-laminated regions of the conductive underlayer where the one or more fourth plating bodies and one or more fifth plating bodies are not laminated after the forming one or more fifth plating bodies, so that the first interconnect is formed as a third laminated structure including the conductive underlayer and a corresponding one of the one or more fourth plating bodies, and the second interconnect is formed as a fourth laminated structure including the conductive underlayer and a corresponding one of the one or more fifth plating bodies.

DESCRIPTION OF THE EMBODIMENTS

Figure 1:
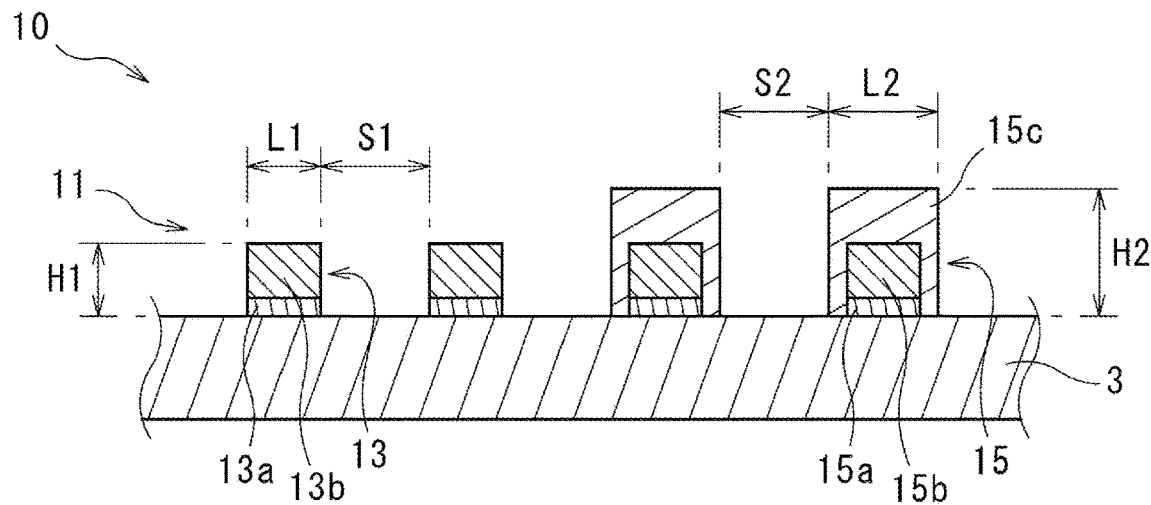
FIG. 1 is a schematic cross-sectional view of a flexible printed circuit board according to a first embodiment.

Description of Embodiments of the Present Disclosure

A flexible printed circuit board according to one aspect of the present disclosure is a flexible printed circuit board including a base film having an insulating property and multiple interconnects laminated to at least one surface side of the base film. The multiple interconnects include one or more first interconnects and one or more second interconnects having an average thickness greater than the average thickness of the first interconnect in the same plane. A ratio of the average thickness of the second interconnect to the average thickness of the first interconnect is greater than or equal to 1.5 and less than or equal to 50. The first interconnect includes a first conductive underlayer and a first plating layer, and the second interconnect includes a second conductive underlayer, a second plating layer, and a third plating layer.

In the flexible printed circuit board, the ratio of the average thickness of the second interconnect to the average thickness of the first interconnect is within the above-described range, so that the electrical resistance of the second interconnect can be made smaller than the electrical resistance of the first interconnect when compared in the same line width. Additionally, the line width of the second interconnect can be made less than the line width of the first interconnect when compared with the same electrical resistance. Therefore, the flexible printed circuit board can reduce the electrical resistance of the entirety of interconnects and can achieve space-savings.

The average line width of the first interconnect is preferably greater than or equal to 3 μm and less than or equal to 100 μm, and the average interval of the first interconnects is preferably greater than or equal to 3 μm and less than or equal to 100 μm.

As described above, the average line width and the average interval of the first interconnects are within the above-described range, so that greater space-savings of the flexible printed circuit board can be achieved.

The average line width of the second interconnect is preferably greater than or equal to 5 μm and less than or equal to 100 μm, and the average interval of the second interconnects is preferably greater than or equal to 5 μm and less than or equal to 100 μm.

As described above, the average line width and the average interval of the second interconnects are within the above-described range, so that greater space-savings of the flexible printed circuit board can be achieved.

A ratio of a minimum cross-sectional area of the second interconnect in the thickness direction to a minimum cross-sectional area of the first interconnect in the thickness direction is preferably greater than or equal to 0.5 and less than or equal to 200.

As described above, the ratio of the minimum cross-sectional area of the second interconnect in the thickness direction to the minimum cross-sectional area of the first interconnect in the thickness direction is within the above-described range, so that greater space-savings of the flexible printed circuit board can be achieved even though the electrical resistance of the first interconnect is relatively close to the electrical resistance of the second interconnect.

A ratio of the average thickness to the minimum line width in the first interconnect is preferably greater than or equal to 0.3 and less than or equal to 5, and a ratio of the average thickness to the minimum line width in the second interconnect is preferably greater than or equal to 0.5 and less than or equal to 10.

As described above, the ratio of the average thickness to the minimum line width in the first interconnect is within the above-described range, and the ratio of the average thickness to the minimum line width of the second interconnect is within the above-described range, so that greater space-savings of the flexible printed circuit board can be achieved.

A method of manufacturing a flexible printed circuit board according to another aspect of the present disclosure is a method of manufacturing a flexible printed circuit board including a base film having an insulating property and multiple interconnects laminated to at least one side surface of the base film. The multiple interconnects include one or more first interconnects and one or more second interconnects having an average thickness greater than the average thickness of the first interconnect in the same plane. The ratio of the average thickness of the second interconnect to the average thickness of the first interconnect is greater than or equal to 1.5 and less than or equal to 50. The method includes a first plating step of forming one or more first plating bodies and one or more second plating bodies by electroplating a first metallic material on a conductive underlayer of the base film by using a first resist pattern, the conductive underlayer being laminated to at least one side surface of the base film, a first removing step of removing the first resist pattern and non-laminated regions of the conductive underlayer where the first plating bodies and the second plating bodies are not laminated after the first plating step, a second plating step of forming one or more third plating bodies by electroplating a second metallic material on the one or more second plating bodies by using a second resist pattern after the first removing step, and a second removing step of removing the second resist pattern after the second plating step. The first interconnect is formed as a first laminated structure including a portion of the conductive underlayer and the first plating body. The second interconnect is formed as a second laminated structure including another portion of the conductive underlayer, the second plating body, and the third plating body.

According to the method of manufacturing the flexible printed circuit board, the flexible printed circuit board described above can be manufactured. That is, the flexible printed circuit board that can reduce the electrical resistance of the entirety of interconnects and achieve space-savings can be manufactured.

A method of manufacturing a flexible printed circuit board according to a different aspect of the present disclosure is a method of manufacturing a flexible printed circuit board including a base film having an insulating property and multiple interconnects laminated to at least one side s of the base film. The multiple interconnects include one or more first interconnects and one or more second interconnects having an average thickness greater than the average thickness of the first interconnect in the same plane. A ratio of the average thickness of the second interconnect to the average thickness of the first interconnect is greater than or equal to 1.5 and less than or equal to 50. The method includes a third plating step of forming one or more fourth plating bodies by electroplating a third metallic material on a conductive underlayer of the base film by using a third resist pattern, the conductive underlayer being laminated to at least one side surface of the base film, a third removing step of removing the third resist pattern after the third plating step, a fourth plating step of forming one or more fifth plating bodies having an average thickness greater than the average thickness of the fourth plating bodies by electroplating a fourth metallic material on non-laminated regions of the conductive underlayer where the fourth plating bodies are not laminated by using a fourth resist pattern after the third removing step, a fourth removing step of removing the fourth resist pattern and the non-laminated regions of the conductive underlayer where the fourth plating bodies and the fifth plating bodies are not laminated after the fourth plating step. The first interconnect is formed as a third laminated structure including a portion of the conductive underlayer and the fourth plating body, and the second interconnect is formed as a fourth laminated structure including another portion of the conductive underlayer and the fifth plating body.

According to the method of manufacturing the flexible printed circuit board, the flexible printed circuit board described above can be manufactured. That is, the flexible printed circuit board that can reduce the electrical resistance of the entirety of interconnects and achieve space-savings can be manufactured.

Here, the "average thickness" indicates an average of the thickness measured at any ten points in one interconnect. The "thickness" indicates a distance between the base film and a top edge of the interconnect in a direction perpendicular to the base film. The "line width" indicates the dimension in a direction perpendicular to the longitudinal direction of a single interconnect. The "interval" indicates a distance between adjacent surfaces of two interconnects facing each other, and the "average interval" indicates a value obtained by measuring the distance between respective adjacent surfaces at multiple positions in the longitudinal direction of the interconnect, and calculating an average value of the measurement results. The "average line width" indicates a value obtained by measuring the maximum width of the interconnect at multiple positions in the longitudinal direction, in a cross section perpendicular to the longitudinal direction of the interconnect, and calculating an average value of the measurement results. The "minimum cross-sectional area" indicates a minimum value of a cross-sectional area perpendicular to the longitudinal direction of the interconnect in one interconnect. The "minimum line width" indicates a minimum value of the line width in one interconnect. However, a land portion including a via (a through-hole, a blind via, and a field via) for connecting between interconnects, a land portion connected to mounting components, a land portion used for connecting to another printed circuit board or a connector, and the like will be excluded from measuring the "thickness," the "line width," the "interval", and the "cross-sectional area" specified above. The "interconnect" corresponds to a "wiring layer".

Details of Embodiments of the Present Disclosure

In the following, an embodiment of the flexible printed circuit board according to the present disclosure and a method of manufacturing the flexible printed circuit board will be described in detail with reference to the drawings. In the embodiment, a "front surface side" refers to a side in the thickness direction of the base film where the interconnects are laminated, and the front and the back in the embodiment is not meant to determine the front and the back when the flexible printed circuit board is used.

First Embodiment

[Flexible Printed Circuit Board]

As illustrated in FIG. 1, a flexible printed circuit board 10 according to the present embodiment mainly includes a base film 3 having an insulating property and interconnects 11 laminated to one side (i.e., the front surface side) of the base film 3. The flexible printed circuit board 10 may further include a cover film on the front surface side of the base film 3 or the interconnects 11.

<Base Film>

The base film 3 is a layer made of a synthetic resin having an insulating property. The base film 3 also has a flexible property. The base film 3 is also a substrate for forming the interconnects 11. As a material of forming the base film 3, a low dielectric constant synthetic resin film formed as a sheet may be employed, although the material is not particularly limited as long as the base film is made of a material having an insulating property and a flexible property. Examples of a main component of the synthetic resin film include polyimides, polyethylene terephthalates, liquid crystal polymers, fluoropolymers, and the like. The term "main component" indicates a component contained with the highest percentage and, for example, a component occupying 50 mass % or more of forming materials. The base film 3 may contain another resin other than example resins such as polyimides, and may contain antistatic agents and the like.

The lower limit of the average thickness of the base film 3 is not particularly limited, but is preferably 3 μm, more preferably 5 μm, and even more preferably 10 μm. The upper limit of the average thickness of the base film 3 is not particularly limited, but is preferably 200 μm, more preferably 150 μm, and even more preferably 100 μm. If the average thickness of the base film 3 is below the lower limit, the insulation strength and mechanical strength of the base film 3 might be insufficient. If the average thickness of the base film 3 exceeds the upper limit, the flexible printed circuit board 10 might become unnecessarily thick. Here, the "average thickness" indicates an average of the thickness measured at any 10 points, as described above.

<Interconnects>

The interconnects 11 are laminated directly or through another layer on the front surface side of the base film 3. The interconnects 11 include multiple first interconnects 13 and multiple second interconnects 15 having an average thickness H2 greater than an average thickness H1 of the first interconnect in the same plane (i.e., here, in the same plane on the front surface side). The ratio of the average thickness H2 of the second interconnect 15 to the average thickness H1 of the first interconnect 13 is greater than or equal to 1.5 and less than or equal to 50.

(First Interconnect)

The first interconnect 13 includes a first conductive underlayer 13a laminated to the front surface side of the base film 3 and a first plating layer 13b laminated to the first conductive underlayer 13a on a side opposite to the base film 3 (i.e., the front surface side). Examples of the first interconnect 13 include a signal line for transmitting a signal, a current line for supplying a current for power supply, a current line for supplying a current for generating a magnetic field, and the like.

Examples of the material forming the first conductive underlayer 13a include copper (Cu), silver (Ag), gold (Au), nickel (Ni), titanium (Ti), chromium (Cr), alloys of these materials, stainless steel, and the like. For these forming materials, in order to suppress thermal degradation of an adhesive force of the first interconnect 13 to the base film 3, it is preferable that the first conductive underlayer 13a includes a layer (i.e., a first layer) that contains at least one selected from a group consisting of nickel, chromium, titanium, and silver on a side being in contact with the base film 3 (e.g., polyimides). Further, it is more preferable that the first conductive underlayer 13a includes a layer (i.e., the first layer) that contains at least one selected from nickel and chromium that are easily removable and that easily maintain an insulating property. Additionally, it is more preferable that the first conductive underlayer 13a includes a layer (i.e., a second layer) having copper as a main material on an upper side of the first inner layer (i.e., a side opposite to the base film 3). The layer having copper as a main material is disposed, so that the work time required when the first interconnects 13 are formed by electroplating can be shortened.

For example, the lower limit of the average thickness of the first layer is preferably 1 nm and more preferably 2 nm. The upper limit of the average thickness of the first layer is preferably 15 nm and more preferably 8 nm. If the average thickness is below the lower limit, thermal degradation of the adhesive force of the first interconnect 13 to the base film 3 might not be easily suppressed. If the average thickness exceeds the upper limit, the first layer might not be easily removable and the insulating property between the first interconnects 13 may not be sufficiently maintained. The first layer may be formed by a sputtering method, an electroplating method, an electroless plating method, or the like.

For example, the lower limit of the average thickness of the second layer is preferably 0.1 μm and more preferably 0.2 μm. The upper limit of the average thickness of the second layer is preferably 2 μm and more preferably 1 μm. If the average thickness is below the lower limit, the work time required for forming the interconnects 11 by electroplating might be excessively long. If the average thickness exceeds the upper limit, the second layer might not be easily removable and the insulating property between the first interconnects 13 might not be sufficiently maintained. The second layer is preferably formed by a sputtering method, an electroplating method, an electroless plating method, or the like, and may be formed by combining these methods. In particular, it is preferable that an electroless copper plating layer is disposed on a top surface side of the first conductive underlayer 13a, so that when the inner layer is formed by a sputtering method, any defect or the like that may be caused by the sputtering method can be covered.

Examples of the first metallic material for forming the first plating layer 13b include copper, aluminum, silver, gold, nickel, alloys of these materials, and the like. Among these materials, copper or a copper alloy are preferable from the viewpoint of improving conductivity and reducing cost. For example, the first plating layer 13b is formed in the same shape as the first conductive underlayer 13a viewed in a direction perpendicular to the base film 3.

Since the first plating layer 13b is much thicker than the first conductive underlayer 13a, the thickness of the first interconnect 13 can be mainly determined by the thickness of the first plating layer 13b.

The average thickness H1 of the first interconnect 13 can be suitably set so that the ratio of the average thickness H2 of the second interconnect 15 to the average thickness H1 of the first interconnect 13 is greater than or equal to 1.5 and less than or equal to 50. For example, the lower limit of the average thickness H1 of the first interconnect 13 is preferably 3 μm, more preferably 5 μm, and even more preferably 10 μm. The upper limit of the average thickness H1 of the first interconnect 13 is preferably 30 μm, more preferably 25 μm, and even more preferably 20 μm. If the average thickness H1 is below the lower limit, the mechanical strength of the first interconnect 13 might be insufficient. Additionally, the electrical resistance of the first interconnect 13 might become excessively large, and there is a possibility that a predetermined current will be unable to flow. If the average thickness H1 exceeds the upper limit, the line width might require increasing in order to form the first interconnect 13, and there is a possibility that sufficient space-savings cannot be achieved. The "average thickness" is a value obtained for each of the first interconnects 13 by exposing a cross-section of the flexible printed circuit board 10 by using a cross-section processing device such as a microtome, measuring the thickness obtained by cross-section observations at any ten points in the first interconnect 13, and calculating an average value of the measurement results. In the following, the "average thickness" of other members and the like is a value measured in substantially the same manner.

The lower limit of the ratio of the average thickness H1 to the minimum line width (which is not illustrated) of the first interconnect 13 (i.e., an aspect ratio), is preferably 0.3, more preferably 0.5, and even more preferably 0.7. The upper limit of the ratio is preferably 5, more preferably 2, and even more preferably 1.0. If the ratio is below the lower limit, there is a possibility that sufficient space-savings cannot be achieved. If the ratio exceeds the upper limit, there is a possibility that sufficient space-savings cannot be achieved. Additionally, the flexibility of the flexible printed circuit board 10 might be reduced, and the flexible printed circuit board 10 might become broken during bending processing, for example. The "minimum line width" is a value obtained for each of the first interconnects 13 by exposing the cross-section of the flexible printed circuit board 10 by using a cross-section processing device such as a microtome, and measuring the line width by using a microscope or the like that can measure the length of a narrowest portion. However, the "minimum line width" is the width of the narrowest portion in a region excluding any defective region of the first interconnect 13. Here, the defective region to be removed from regions to be measured is a region that is recessed inward (or missing) from at least one edge in the width direction when the microscope observation is performed as described above. Specifically, the defective region is a region in which the width of a missing portion at maximum is ¼ or more of the average line width of the other regions (i.e., regions other than the defective region) in the longitudinal direction of the first interconnect 13. The average line width is measured in a manner similar to the method of measuring the "average line width" described below. In the following, the "minimum line width" of other members and the like is also measured in substantially the same manner.

The minimum line width of the first interconnect 13 may be suitably set to satisfy, for example, the aspect ratio described above. For example, the lower limit of the minimum line width of the first interconnect 13 is preferably 3 µm, more preferably 5 µm, and even more preferably 10 µm. The upper limit of the minimum line width of the first interconnect 13 is preferably 30 µm, more preferably 25 µm, and even more preferably 20 µm. If the minimum line width is below the lower limit, the mechanical strength of the first interconnect 13 might be insufficient. If the minimum line width exceeds the upper limit, there is a possibility that sufficient space-savings cannot be achieved.

When multiple first interconnects 13 are disposed adjacent to each other, the lower limit of the average line width L1 of the first interconnect 13 is preferably 3 µm, more preferably 5 µm, and even more preferably 10 µm. The upper limit of the average line width L1 of the first interconnect 13 is preferably 100 µm, more preferably 75 µm, and even more preferably 50 µm. If the average line width L1 of the first interconnect 13 is below the lower limit, the mechanical strength might be insufficient. If the average line width L1 of the first interconnect 13 exceeds the upper limit, there is a possibility that sufficient space-savings cannot not be achieved. The "average line width" is a value obtained by exposing the cross-section of the flexible printed circuit board 10 with a cross-section processing device such as a microtome, measuring the width at multiple positions in the first interconnect 13 by using a microscope or the like that can measure the length of a widest portion in the width, and calculating an average of measured values. In the following, the "average line width" of other members and the like is also measured in substantially the same manner.

When multiple first interconnects 13 are disposed adjacent to each other, the lower limit of the average interval S1 of the first interconnects 13 is preferably 3 µm, more preferably 5 µm, and even more preferably 10 µm. The upper limit of the average interval S1 of the first interconnects 13 is preferably 100 µm, more preferably 75 µm, and even more preferably 50 µm. If the average interval S1 of the first interconnects 13 is below the lower limit, a short circuit might occur. If the average interval S1 of the first interconnects 13 exceeds the upper limit, there is a possibility that sufficient space-savings cannot be achieved. The "average interval" is a value obtained by exposing the cross-section of the flexible printed circuit board 10 by using a cross-section processing device such as a microtome, measuring the distances between the first interconnects 13 at multiple positions by using a microscope that can measure the smallest distance, and calculating an average value of the measurement results. In the following, the "average interval" of other members and the like is measured in substantially the same manner.

The minimum cross-sectional area in the thickness direction of the first interconnect 13 can be suitably set so that the ratio of the minimum cross-sectional area in the thickness direction of the second interconnect 15 to the minimum cross-sectional area in the thickness direction of the first interconnect 13 (i.e., the minimum cross-sectional area of the second interconnect 15/the minimum cross-sectional area of the first interconnect 13) is within a predetermined range. The lower limit of the ratio, for example, is preferably 0.5, and more preferably 0.7. The upper limit of the ratio is preferably 200, more preferably 20, and even more preferably 5. If the ratio is below the lower limit, the line width of the first interconnect 13 might be relatively too large to achieve sufficient space-savings. If the ratio exceeds the upper limit, the line width or the interval of the second interconnect 15 might be relatively too large to achieve sufficient space-savings. The "minimum cross-sectional area" is calculated by multiplying the average thickness H1 by the minimum line width. In the following, the "minimum cross-sectional area" of other members and the like is measured in substantially the same manner.

(Second Interconnect)

The second interconnect 15 includes a second conductive underlayer 15a that is thin and laminated to the front surface side of the base film 3, a second plating layer 15b laminated to the second conductive underlayer 15a on a side opposite to the base film 3 (i.e., the front surface side), and a third plating layer 15c laminated to the base film 3 so as to cover the second conductive underlayer 15a and the second plating layer 15b. Examples of the second interconnect 15 include an operation power line, a ground line, and the like of a connected device.

A material of forming the second conductive underlayer 15a is of the same kind as the material of forming the first conductive underlayer 13a described above. The average thickness of the second conductive underlayer 15a is set to be similar to the average thickness of the first conductive underlayer 13a described above.

The second plating layer 15b is formed with the first plating layer 13b by using the first metallic material for forming the first plating layer 13b of the first interconnect 13 described above. That is, the metallic material for forming the second plating layer 15b is the first metallic material described above. For example, the second plating layer 15b is formed in the same shape as the second conductive underlayer 15a viewed in the direction perpendicular to the base film 3.

Examples of the second metallic material for forming the third plating layer 15c include copper, aluminum, silver, gold, nickel, alloys of these materials, and the like. Among these materials, copper or copper alloys are preferable from the viewpoint of improving conductivity and reducing cost. It is preferable that the second metallic material is of the same kind as the first metallic material described above. For example, the third plating layer 15c is formed in a shape having a line width greater than the line width of the second conductive underlayer 15a and the second plating layer 15b viewed in the direction perpendicular to the base film 3.

Since the second plating layer 15b and the third plating layer 15c are much thicker than the second conductive underlayer 15a, the thickness of the second interconnect 15 can be mainly determined by the thickness of the second plating layer 15b and the third plating layer 15c.

The average thickness H2 of the second interconnect 15 can be suitably set so that the ratio of the average thickness H2 of the second interconnect 15 to the average thickness H1 of the first interconnect 13 described above is greater than or equal to 1.5 and less than or equal to 50. For example, the lower limit of the average thickness H2 of the second interconnect 15 is preferably 5 μm, more preferably 10 μm, and even more preferably 20 μm. The upper limit of the average thickness H2 of the second interconnect 15 is preferably 100 μm, more preferably 75 μm, and even more preferably 50 μm. If the average thickness H2 is below the lower limit, the mechanical strength of the second interconnect 15 might be insufficient. Additionally, there is a possibility that the electrical resistance of the second interconnect 15 becomes excessively large, and a predetermined current will be unable to flow. If the average thickness H2 exceeds the upper limit, it might be necessary to increase the line width in order to form the second interconnect 15, and there is a possibility that sufficient space-savings cannot be achieved.

The lower limit of the ratio of the average thickness H2 to the minimum line width (which is not illustrated) of the second interconnect 15 (i.e., an aspect ratio), is preferably 0.5, more preferably 1, and even more preferably 2. The upper limit of the ratio is preferably 10, more preferably 7, and even more preferably 5. If the ratio is below the lower limit, there is a possibility that sufficient space-savings cannot be achieved. If the ratio exceeds the upper limit, there is also a possibility that sufficient space-savings cannot be achieved.

The minimum line width of the second interconnect 15 can be suitably set to satisfy, for example, the aspect ratio described above. For example, the lower limit of the minimum line width of the second interconnect 15 is preferably 5 μm, more preferably 10 μm, and even more preferably 15 μm. The upper limit of the minimum line width of the second interconnect 15 is preferably 100 μm, more preferably 75 μm, and even more preferably 50 μm. If the minimum line width is below the lower limit, the mechanical strength of the second interconnect 15 might be insufficient. If the minimum line width exceeds the upper limit, there is a possibility that t sufficient space-savings cannot be achieved. Additionally, the flexibility of the flexible printed circuit board 10 will be reduced, and the flexible printed circuit board 10 might become broken during bending processing, for example.

When multiple second interconnects 15 are disposed adjacent to each other, the lower limit of the average line width L2 of the second interconnect 15 is preferably 5 μm, more preferably 10 μm, and even more preferably 15 μm. The upper limit of the average line width L2 of the second interconnect 15 is preferably 100 μm, more preferably 75 μm, and even more preferably 50 μm. If the average line width L2 of the second interconnect 15 is below the lower limit, the mechanical strength of the second interconnect 15 might be insufficient. If the average line width L2 of the second interconnect 15 exceeds the upper limit, there is a possibility that sufficient space-savings cannot be achieved. In the embodiment illustrated in FIG. 1, the average line width L2 of the second interconnect 15 is set to be greater than the average line width L1 of the first interconnect 13.

When the multiple second interconnects 15 are disposed adjacent to each other, the lower limit of the average interval S2 of the second interconnects 15 is preferably 5 μm, more preferably 10 μm, and even more preferably 15 μm. The upper limit of the average interval S2 of the second interconnects 15 is preferably 100 μm, more preferably 75 μm, and even more preferably 50 μm. If the average interval S2 of the second interconnects 15 is below the lower limit, a short circuit might occur. If the average interval S2 of the second interconnects 15 exceeds the upper limit, there is a possibility that sufficient space-savings cannot be achieved. In the embodiment illustrated in FIG. 1, the average interval S2 of the second interconnects 15 is set to be the same as the average interval S1 of the first interconnects 13.

The minimum cross-sectional area of the second interconnect 15 in the thickness direction can be suitably set so that the ratio of the minimum cross-sectional area of the second interconnect 15 to the minimum cross-sectional area of the first interconnect 13 in the thickness direction is within the predetermined range as described above.

(Ratio of the Average Thickness of the Second Interconnect to the Average Thickness of the First Interconnect)

The lower limit of the ratio of the average thickness H2 of the second interconnect 15 to the average thickness H1 of the first interconnect 13 is, as described above, 1.5, preferably 2, and more preferably 3. The upper limit of the ratio is, as described above, 50, and preferably 20, and more preferably 5. If the ratio is below the lower limit, there is a possibility that the electrical resistance of the entirety of interconnects cannot be reduced. Additionally, there is a possibility that sufficient space-savings cannot be achieved. If the ratio exceeds the upper limit, there is also a possibility that sufficient space-savings cannot be achieved.

<Advantage>

In the flexible printed circuit board 10, by configuring the ratio of the average thickness H2 of the second interconnect 15 to the average thickness H1 of the first interconnect 13 to be greater than or equal to 1.5 and less than or equal to 50, the electrical resistance of the second interconnect 15 can be made smaller than the electrical resistance of the first interconnect 13 when compared in the same line width. Additionally, when compared with the same electrical resistance, the line width of the second interconnect 15 can be made less than the line width of the first interconnect 13. Therefore, the flexible printed circuit board 10 can reduce the electrical resistance of the entirety of interconnects and can achieve space-savings.

[Method of Manufacturing the Flexible Printed Circuit Board]

Next, a method of manufacturing the flexible printed circuit board according to the embodiment will be described by using the flexible printed circuit board 10.

The method of manufacturing the flexible printed circuit board 10 includes a first plating step of forming multiple first plating bodies X1 and multiple second plating bodies X2 by electroplating the first metallic material on a conductive underlayer M of the base film 3 by using a first resist pattern R1, the conductive underlayer M being laminated to one surface side (i.e., a front surface side) of the base film 3, a first removing step of removing the first resist pattern R1 and non-laminated regions of the conductive underlayer M where the first plating bodies X1 and the second plating bodies X2 are not laminated after the first plating step, a second plating step of forming third plating bodies X3 by electroplating the second metallic material on the second plating bodies X2 by using a second resist pattern R2 after the first removing step, and a second removing step of removing the second resist pattern R2 after the second plating step. The first interconnect 13 is formed as a first laminated structure including a portion of the conductive underlayer M (i.e., the first conductive underlayer 13a) and the first plating body X1. The second interconnect 15 is formed as a second laminated structure including another portion of the conductive underlayer M (i.e., the second conductive underlayer 15a), the second plating body X2, and the third plating body X3.

<Conductive Underlayer>

The conductive underlayer M is laminated to the front surface side of the base film 3. The conductive underlayer M is previously laminated to the entire surface of the base film 3 on the front surface side. A portion of the conductive underlayer M ultimately becomes the first conductive underlayer 13a in the first interconnect 13, and another portion of the conductive underlayer M ultimately becomes the second conductive underlayer 15a in the second interconnect 15.

Examples of a material of forming the conductive underlayer M include copper (Cu), silver (Ag), gold (Au), nickel (Ni), titanium (Ti), chromium (Cr), alloys of these materials, stainless steel, and the like. For the material of forming the conductive underlayer M, it is preferable that the conductive underlayer M includes a layer (i.e., a first layer) containing at least one selected from a group consisting of nickel, chromium, titanium, and silver on a side being in contact with the base film 3 (e.g., polyimides) in order to suppress thermal degradation of the adhesion force of the first interconnect 13 and the second interconnect 15 to the base film 3. Further, it is more preferable that the conductive underlayer M includes a layer (i.e., the first layer) containing at least one selected from nickel and chromium that are easily removable and that easily maintain an insulating property. Additionally, it is more preferable that the conductive underlayer M includes a layer mainly composed of copper (i.e., a second layer) on the upper side of the first inner layer (i.e., a side opposite to the base film 3). By providing the layer mainly composed of copper, the work time required for forming the first interconnect 13 and the second interconnect 15 by electroplating can be shorten.

For example, the lower limit of the average thickness of the first layer is preferably 1 nm and more preferably 2 nm. The upper limit of the average thickness of the first layer is preferably 15 nm and more preferably 8 nm. If the average thickness of the first layer is below the lower limit, it might be difficult to suppress thermal degradation of the adhesion force of the first interconnect 13 and the second interconnect 15 to the base film 3. If the average thickness of the first layer exceeds the upper limit, the first layer might not be easily removable, and there is a possibility that the insulating property between the respective first interconnects 13 and between the respective second interconnects 15 cannot be sufficiently maintained. The first layer may be formed by a sputtering method, an electroplating method, an electroless plating method, or the like.

For example, the lower limit of the average thickness of the second layer is preferably 0.1 µm and more preferably 0.2 µm. The upper limit of the average thickness of the second layer is preferably 2 µm and more preferably 1 µm. If the average thickness of the second layer is below the lower limit, the time required for forming the interconnects 11 by electroplating might be excessively long. If the average thickness of the second layer exceeds the upper limit, the second layer might not be easily removable and there is a possibility that the insulating property between the respective first interconnects 13 and between the respective second interconnects 15 cannot be sufficiently maintained. The second layer is preferably formed by a sputtering method, an electroplating method, an electroless plating method, or the like, and may be formed by combining these methods. In particular, it is preferable that an electroless copper plating layer is disposed on a top surface side of the conductive underlayer M, so that any defect or the like that may be caused by a sputtering method when the inner layer is formed by the sputtering method can be covered.

<First Plating Step>

The first plating step includes a first resist pattern forming step of forming the first resist pattern R1 on the front surface of the conductive underlayer M and a first and second plating bodies forming step of forming the first plating bodies X1 and the second plating bodies X2 by electroplating the first metallic material on the conductive underlayer M by using the formed first resist pattern R1.

(First Resist Pattern Forming Step)

Figure 2:
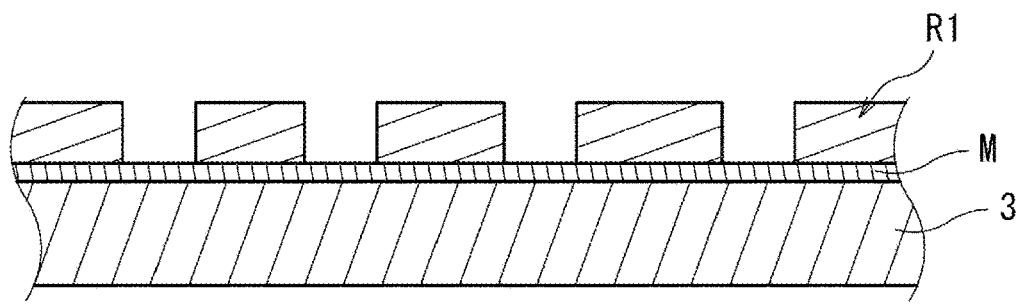
FIG. 2 is a schematic cross-sectional view for describing a method of manufacturing the flexible printed circuit board illustrated in FIG. 1.

In the first resist pattern forming step, the first resist pattern R1 is formed on the front surface of the conductive underlayer M as illustrated in FIG. 2.

Specifically, the first resist pattern R1 having a predetermined pattern is formed by laminating a resist film, such as a photosensitive film, on the front surface of the conductive underlayer M and exposing and developing the laminated resist film. Examples of a method of laminating the resist film include a method of applying a resist composition to the front surface of the conductive underlayer M, a method of laminating a dry film photoresist to the front surface of the conductive underlayer M, and the like. The exposure and development condition of the resist film may be adjusted depending on the resist composition to be used or the like. An opening of the first resist pattern R1 can be suitably set depending on a first plating body X1 and a second plating body X2 to be formed, that is, the first plating layer 13b of the first interconnect 13 and the second plating layer 15b of the second interconnect 15 to be formed.

(First and Second Plating Bodies Forming Step)

Figure 3:
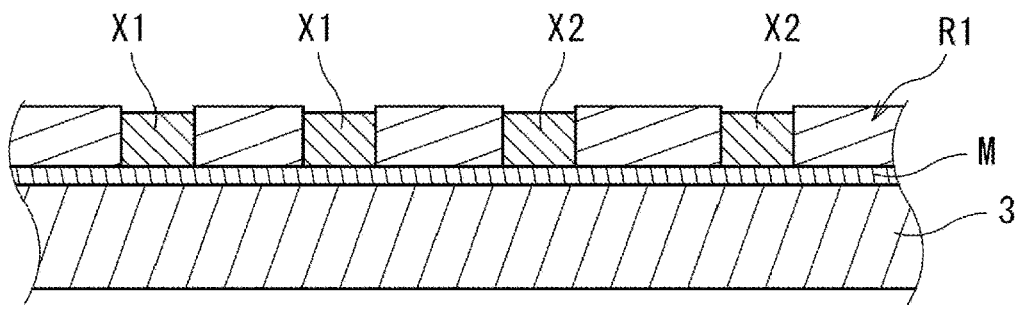
FIG. 3 is a schematic cross-sectional view for describing a method of manufacturing the flexible printed circuit board illustrated in FIG. 1.

In the first and second plating bodies forming step, multiple first plating bodies X1 and multiple second plating bodies X2 are formed on regions of the conductive underlayer M where the resist pattern R1 is not laminated as illustrated in FIG. 3 by electroplating the first metallic material while energizing the conductive underlayer M. The multiple first plating bodies X1 and the multiple second plating bodies X2 are suitably configured but the thicknesses are kept the same. A shape of the first plating body X1 and a shape of the second plating body X2 are not particularly limited. For example, the cross-sectional shape may be set to be a rectangular shape.

<First Removing Step>

The first removing step includes a first stripping step of stripping the first resist pattern R1 from the conductive underlayer M and a first etching step of etching non-laminated regions (i.e., unnecessary regions) of the conductive underlayer M where the first plating bodies X1 and the second plating bodies X2 are not laminated.

(First Stripping Step)

In the first stripping step, the first resist pattern R1 is stripped from the conductive underlayer M. As a stripping solution, a known solution can be used. For example, an alkaline aqueous solution such as sodium hydroxide and potassium hydroxide, an organic acid solution such as alkylbenzene sulfonic acid, compound liquid of an organic amine such as ethanolamine and a polar solvent, or the like can be used.

(First Etching Step)

Figure 4:
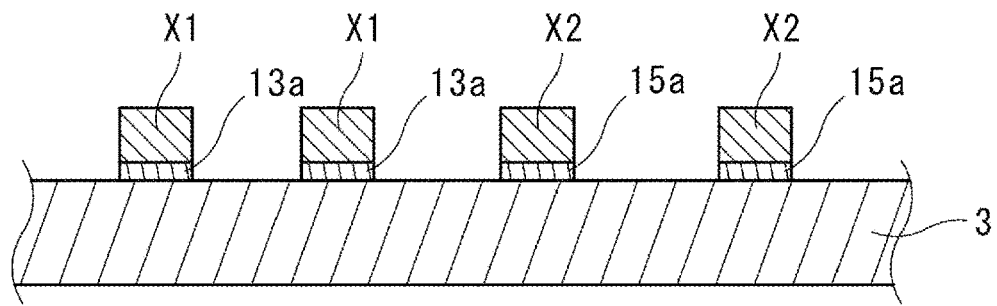
FIG. 4 is a schematic cross-sectional view for describing a method of manufacturing the flexible printed circuit board illustrated in FIG. 1.

In the first etching step, the conductive underlayer M is etched using the first plating bodies X1 and the second plating bodies X2 as a mask. By this etching, a laminated structure in which the first plating bodies X1 are laminated to the base film 3 through the first conductive underlayer 13a and a laminated structure in which the second plating bodies X2 are laminated to the base film 3 through the second conductive underlayer 15a as illustrated in FIG. 4 can be obtained. The etching uses an etching solution that erodes the metal forming the conductive underlayer M. As described, what is called a semi-additive method is preferably used in the manufacturing process.

<Second Plating Step>

The second plating step includes a step of forming the second resist pattern R2 so as to cover the exposed base film 3 and the first plating bodies X1 after the first removing step, and a third plating body forming step of forming the third plating bodies X3 by electroplating the third metallic material on the second plating bodies X2 by using the formed second resist pattern R2.

(Second Resist Pattern Forming Step)

Figure 5:
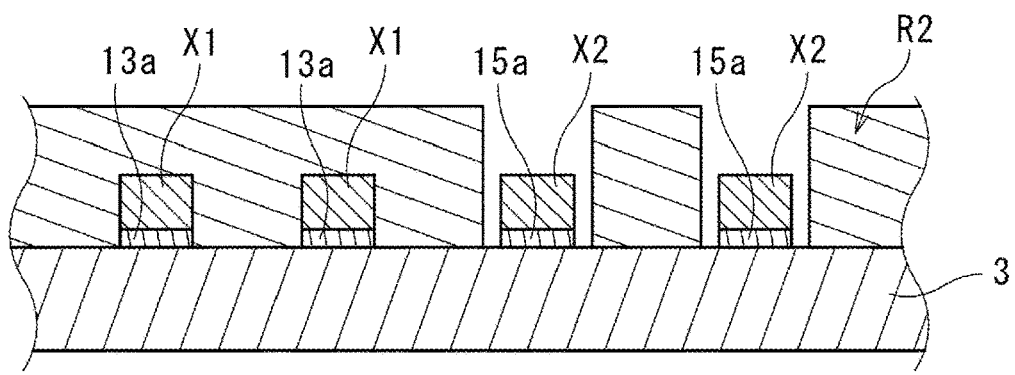
FIG. 5 is a schematic cross-sectional view for describing a method of manufacturing the flexible printed circuit board illustrated in FIG. 1.

In the second resist pattern forming step, as illustrated in FIG. 5, the second resist pattern R2 having a predetermined pattern is formed by laminating a resist film, such as a photosensitive film, so as to cover an entirety of the exposed base film 3, the first conductive underlayers 13a, the first plating bodies X1, the second conductive underlayers 15a, and the second plating bodies X2, and exposing and developing regions overlapping the second plating bodies X2 in the laminated resist film. Examples of a method of laminating the resist film include a method of applying a resist composition so as to cover the entirety, a method of laminating a dry film photoresist to the entirety, and the like. The exposure and development condition of the resist film can be adjusted depending on the resist composition to be used or the like. An opening of the second resist pattern R2 can be suitably set, so that the second plating body X2 is formed in the opening, and can be suitably set depending on the third plating body X3 to be formed, that is, the third plating layer 15c of the second interconnect 15. The height of the second resist pattern R2 can be suitably set in accordance with the height of the third plating layer 15c of the second interconnect 15.

(Third Plating Step)

Figure 6:
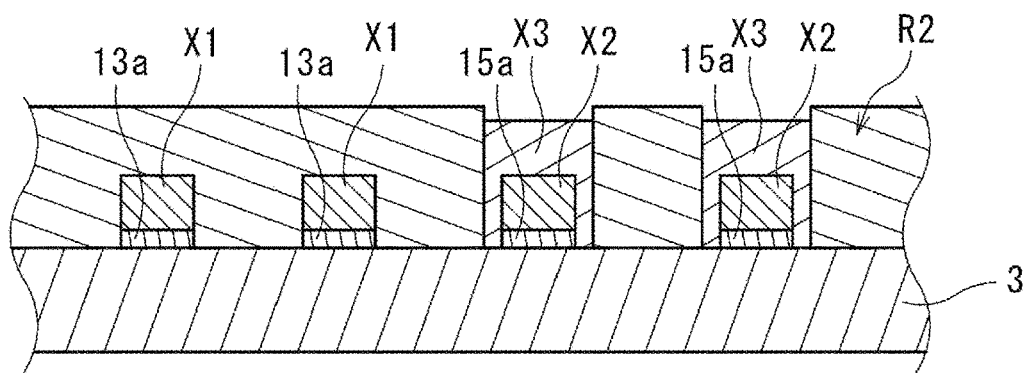
FIG. 6 is a schematic cross-sectional view for describing a method of manufacturing the flexible printed circuit board illustrated in FIG. 1.

In the third plating step, the third plating bodies X3 are formed by electroplating the second metallic material while energizing the first plating bodies X1 and the second plating bodies X2 so as to respectively cover the second conductive underlayers 15a and the second plating bodies X2 in regions where the second resist pattern R2 is not laminated as illustrated in FIG. 6.

<Second Removing Step>

In the second removing step, the second resist pattern R2 is removed from the base film 3. Specifically, the second resist pattern R2 is stripped from the base film 3. The stripping solution may be similar to the stripping solution used in the first stripping step described above. By this stripping, as illustrated in FIG. 1 and FIG. 6, the first laminated structure (corresponding to the first interconnect 13) formed by laminating the first conductive underlayer 13a and the first plating body X1 (corresponding to the first plating layer 13b) to the base film 3, and the second laminated structure (corresponding the to second interconnect 15) formed by laminating the second conductive underlayer 15a, the second plating body X2 (corresponding to the second plating layer 15b), and the third plating body X3 (corresponding to the third plating layer 15c) to the base film 3 are obtained.

<Advantage>

According to the method of manufacturing the flexible printed circuit board 10, the flexible printed circuit board 10 described above can be manufactured. That is, the flexible printed circuit board 10 that can reduce the electrical resistance of the entirety of interconnects and achieve space-savings can be manufactured.

Second Embodiment

Next, a flexible printed circuit board according to a second embodiment and a method of manufacturing the flexible printed circuit board will be described. Components common to the first embodiment will be referenced by the same reference numerals and the description will be omitted.

[Flexible Printed Circuit Board]

Figure 7:
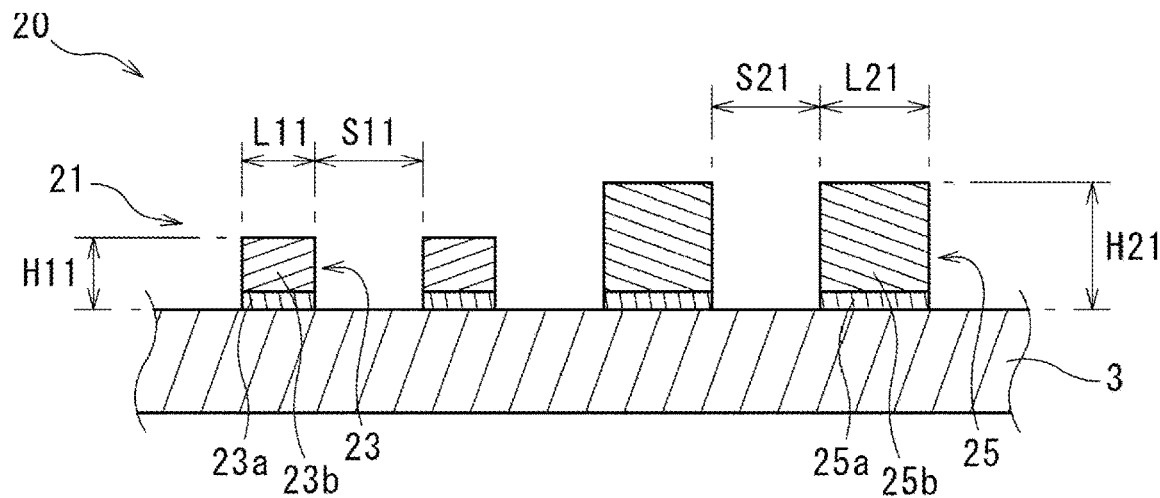
FIG. 7 is a schematic cross-sectional view of a flexible printed circuit board according to a second embodiment.

As illustrated in FIG. 7, the flexible printed circuit board 20 according to the second embodiment mainly includes the base film 3 having an insulating property and multiple interconnects 21 laminated to one side (i.e., the front surface side) of the base film 3. The flexible printed circuit board 20 may further include a cover film on the front surface side of the base film 3 or the interconnects 21.

<Multiple Interconnects>

The multiple interconnects 21 are laminated directly or through another layer to the front surface side of the base film 3. The multiple interconnects 21 include one or more first interconnects 23 and one or more second interconnects 25 having an average thickness H21 greater than an average thickness H11 of the first interconnect 23 in the same plane (here, the same plane on the front surface side). The ratio of the average thickness H21 of the second interconnect 25 to the average thickness H11 of the first interconnect 23 is greater than or equal to 1.5 and less than or equal to 50.

(First Interconnect)

As the first interconnect 23, a structure similar to the first interconnect 13 according to the first embodiment described above can be employed. Thus, the detailed description of the first interconnect 23 is omitted. That is, the first interconnect 23 includes a third conductive underlayer 23a and a fourth plating layer 23b similar to the first conductive underlayer 13a and the first plating layer 13b of the first interconnect 13. As a material of forming the third conductive underlayer 23a, a material similar to the material of forming the first conductive underlayer 13a according to the first embodiment described above can be used. The third metallic material for forming the fourth plating layer 23b may be similar to the first metallic material for forming the first plating layer 13b according to the first embodiment described above can be used.

The average thickness H11, the ratio of the average thickness H11 to the minimum line width (which is not illustrated), the minimum line width, the average line width L11, the average interval S11, the minimum cross-sectional area in the thickness direction, and the like, of the first interconnect 23 can be set in a manner similar to the first interconnect 13 according to the first embodiment described above.
(Second Interconnect)

The second interconnect 25 includes a fourth conductive underlayer 25a that is thin and laminated to the front surface side of the base film 3 and a fifth plating layer 25b that is laminated to a side opposite to the base film 3 (i.e., the front surface side) of the fourth conductive underlayer 25a. Examples of the second interconnect 25 include an operation power line, a ground line, and the like of a connected device.

The line width and interval of the fourth conductive underlayer 25a are greater than the line width and interval of the third conductive underlayer 23a of the first interconnect 23. For a structure of the fourth conductive underlayer 25a except the above, a structure substantially the same as the second conductive underlayer 15a of the second interconnect 15 of the first embodiment described above can be employed. Thus, the detailed description of the second conductive underlayer 25a is omitted. That is, the fourth conductive underlayer 25a is formed by a portion other than regions where the third conductive underlayers 23a are formed in the conductive underlayer M (see, for example, FIG. 8), which will be described later. A material of forming the fourth conductive underlayer 25a is preferably similar to the material of forming the third conductive underlayer 23a.

Examples of the fourth metallic material for forming the fifth plating layer 25b include a material similar to the first metallic material for forming the first plating layer 13b of the first embodiment described above. The fourth metallic material is preferably of the same kind as the third metallic material for forming the fourth plating layer 23b of the first interconnect 23. For example, the fifth plating layer 25b is formed in the same shape as the fourth conductive underlayer 25a viewed in the direction perpendicular to the base film 3.

Since the fifth plating layer 25b is much thicker than the fourth conductive underlayer 25a, the thickness of the second interconnect 25 can be determined mainly by the thickness of the fifth plating layer 25b.

The average thickness H21, the ratio of the average thickness H21 to the maximum line width (which is not illustrated), the minimum line width, the average line width L21, the average interval S21, the minimum cross-sectional area in the thickness direction, and the like, of the second interconnect 25 can be set in a manner similar to the second interconnect 15 of the first embodiment described above.
(Ratio of the Average Thickness of the Second Interconnect to the Average Thickness of the First Interconnect)

The lower limit of the ratio of the average thickness H21 of the second interconnect 25 to the average thickness H11 of the first interconnect 23 is 1.5 as described above, preferably 2, and more preferably 3. The upper limit of the ratio is 50 as described above, preferably 20, and more preferably 5. If the ratio is below the lower limit, there is a possibility that sufficient space-savings cannot be achieved. If the ratio exceeds the upper limit, there is a possibility that sufficient space-savings cannot be achieved.

Additionally, the flexibility of the flexible printed circuit board 10 might be reduced, and the flexible printed circuit board 10 might become broken during bending processing, for example.
<Advantage>

The ratio of the average thickness H21 of the second interconnect 25 to the average thickness H11 of the first interconnect 23 is set from 1.5 to 50 in the flexible printed circuit board 20, so that the electrical resistance of the second interconnect 25 can be reduced to less than the electrical resistance of the first interconnect 23 when compared in the same line width. Additionally, the line width of the second interconnect 25 can be reduced to less than the line width of the first interconnect 23 when compared with the same electrical resistance. Therefore, the flexible printed circuit board 20 reduce the electrical resistance of the entirety of interconnects and can achieve space-savings.
[Method of Manufacturing the Flexible Printed Circuit Board]

A method of manufacturing the flexible printed circuit board according to the second embodiment will be described below by using the flexible printed circuit board 20.

A method of manufacturing the flexible printed circuit board 20 includes a third plating step of forming multiple fourth plating bodies X4 by electroplating the third metallic material on the conductive underlayer M of the base film 3 by using a third resist pattern R3, the conductive underlayer M being laminated to one side (i.e., the front surface side) of the base film 3, a third removing step of removing the third resist pattern R3 after the third plating step, a fourth plating step of forming multiple fifth plating bodies X5 having an average thickness greater than the average thickness of the fourth plating bodies X4 by electroplating the fourth metallic material on non-laminated regions of the conductive underlayer M where the fourth plating bodies X4 are not laminated by using a fourth resist pattern R4 after the third removing step, and a fourth removing step of removing the fourth resist pattern R4 and non-laminated regions of the conductive underlayer M where the fourth plating bodies X4 and the fifth plating bodies X5 are not laminated after the fourth plating step. The first interconnect 23 is formed as a third laminated structure including a third conductive underlayer M3, being a portion of the conductive underlayer M, and the fourth plating body X4. The second interconnect 25 is formed as a fourth laminated structure including a fourth conductive underlayer M4, being another portion of the conductive underlayer M, and the fifth plating body X5.
<Conductive Underlayer>

The conductive underlayer M is similar to the conductive underlayer M used in the first embodiment described above. Therefore, the detailed description of the conductive underlayer M is omitted.
<Third Plating Step>

The third plating step includes a third resist pattern forming step of forming the third resist pattern R3 on the front surface of the conductive underlayer M and a fourth plating body forming step of forming the fourth plating bodies X4 by electroplating the third metallic material on the conductive underlayer M by using the formed third resist pattern R3.
(Third Resist Pattern Forming Step)

Figure 8:
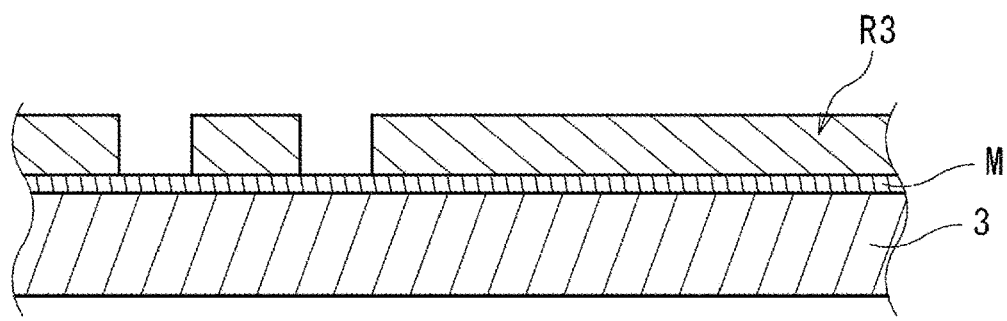
FIG. 8 is a schematic cross-sectional view for describing a method of manufacturing the flexible printed circuit board illustrated in FIG. 7.

In the third resist pattern forming step, the third resist pattern R3 is formed on the front surface of the conductive underlayer M as illustrated in FIG. 8. Specifically, the third resist pattern R3 having a predetermined pattern is formed in a manner similar to the first resist pattern forming step according to the first embodiment. An opening of the third resist pattern R3 can be suitably set in accordance with the third plating body X3 to be formed, that is, the fourth plating layer 23b of the first interconnect 23 to be formed. The opening of the third resist pattern R3 can be suitably set, so that a space for forming the second interconnect 25 remains on the conductive underlayer.
(Fourth Plating Body Forming Step)

Figure 9:
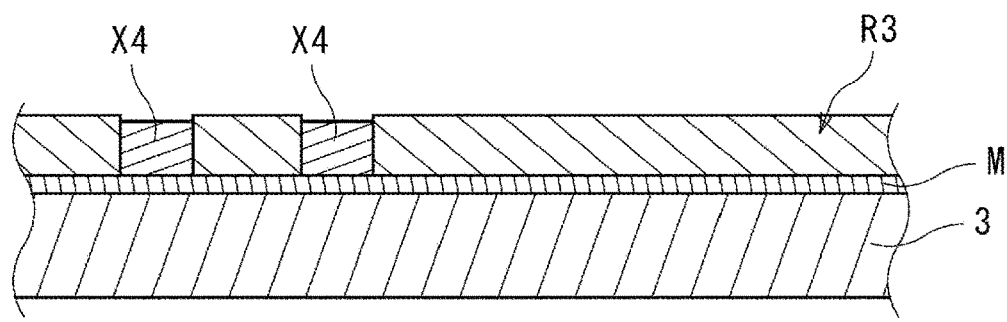
FIG. 9 is a schematic cross-sectional view for describing a method of manufacturing the flexible printed circuit board illustrated in FIG. 7.

In the fourth plating body forming step, the fourth plating bodies X4 are formed on regions of the conductive underlayer M where the third resist pattern R3 is not laminated as illustrated in FIG. 9 by electroplating the fourth metallic material while energizing the conductive underlayer M.
<Third Removing Step>

Figure 10:
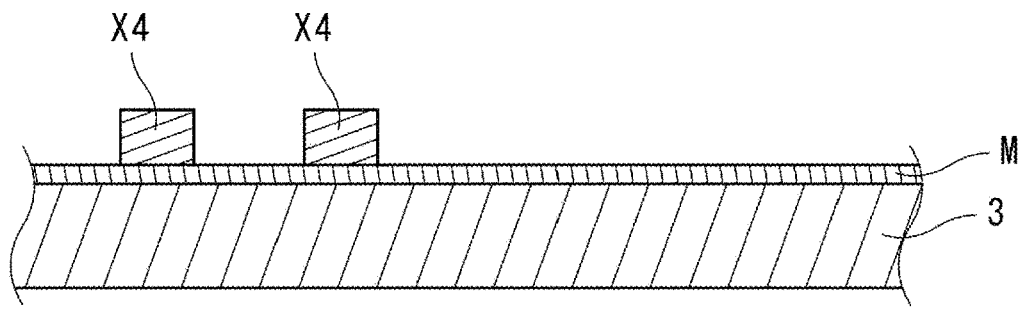
FIG. 10 is a schematic cross-sectional view for describing a method of manufacturing the flexible printed circuit board illustrated in FIG. 7.

In the third removing step, the third resist pattern R3 is removed from the conductive underlayer M. Specifically, the third resist pattern R3 is stripped from the conductive underlayer M (i.e., a third stripping step). The stripping solution is similar to the stripping solution used in the first stripping step of the first embodiment. By this removal, a laminated structure in which the fourth plating body X4 is laminated to the conductive underlayer M as illustrated in FIG. 10 can be obtained.
<Fourth Plating Step>

The fourth plating step includes a fourth resist pattern forming step of forming the fourth resist pattern R4 so as to cover the exposed conductive underlayer M and the fourth plating bodies X4 after the third removing step described above, and a fifth plating body forming step of forming the fifth plating bodies X5 by electroplating the fourth metallic material by using the formed fourth resist pattern R4.

(Fourth Resist Pattern Forming Step)

Figure 11:
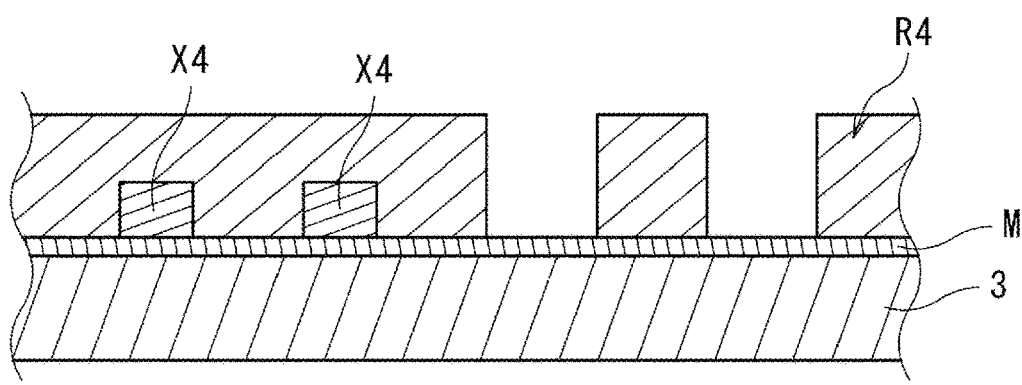
FIG. 11 is a schematic cross-sectional view for describing a method of manufacturing the flexible printed circuit board illustrated in FIG. 7.

In the fourth resist pattern forming step, the fourth resist pattern R4 is formed on the exposed conductive underlayer M as illustrated in FIG. 11. Specifically, the fourth resist pattern R4 having a predetermined pattern is formed by laminating a resist film such as a photosensitive film so as to cover the entirety of the exposed conductive underlayer M and the fourth plating bodies X4, and exposing and developing non-laminated regions of the laminated resist film where the fourth plating bodies X4 are not laminated. As a method of laminating the resist film, a method similar to the method of forming the first resist pattern according to the first embodiment described above can be employed. An opening of the fourth resist pattern R4 can be suitably set in accordance with the fifth plating body X5 to be formed, that is, the fifth plating layer 25b of the second interconnect 25. The height of the fourth resist pattern R4 can be suitably set to be greater than the height of the third resist pattern R3 in accordance to the height of the fifth plating layer 25b of the second interconnect 25.

(Fifth Plating Body Forming Step)

Figure 12:
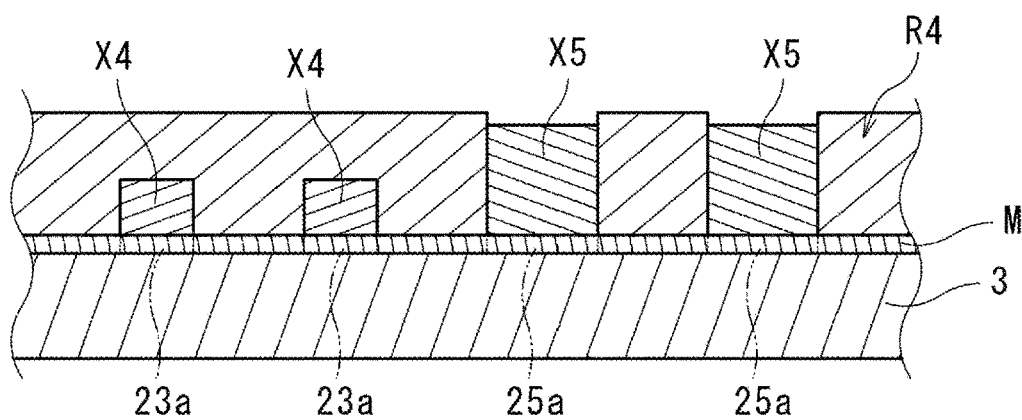
FIG. 12 is a schematic cross-sectional view for describing a method of manufacturing the flexible printed circuit board illustrated in FIG. 7.

In the fifth plating body forming step, the fifth plating bodies X5 having an average thickness greater than the fourth plating bodies X4 are formed in non-laminated regions of the conductive underlayer M where the fourth plating bodies X4 are not laminated as illustrated in FIG. 12 by electroplating the fourth metallic material while energizing the conductive underlayer M.
<Fourth Removing Step>

The fourth removing step includes a second stripping step of stripping the fourth resist pattern R4 from the conductive underlayer M, and a second etching step of etching non-laminated regions (i.e., unnecessary region) of the conductive underlayer M where the fourth plating bodies X4 and the fifth plating bodies X5 are not laminated.

(Second Stripping Step)

In the fourth stripping step, the fourth resist pattern R4 is stripped from the conductive underlayer M. The stripping solution is similar to the striping solution used in the first stripping step according to the first embodiment described above.

(Second Etching Step)

In the second etching step, the conductive underlayer M is etched using the fourth plating bodies X4 and the fifth plating bodies X5 as a mask. By this etching, as illustrated in FIG. 7 and FIG. 12, a third laminated structure (corresponding to the first interconnect 23) in which the third conductive underlayer M3 (corresponding to the third conductive underlayer 23a), being a portion of the conductive underlayer M, and the fourth plating body X4 (corresponding to the fourth plating layer 23b) are laminated to the base film 3, and a fourth laminated structure (corresponding to the second interconnect 25) in which the fourth conductive underlayer M4 (corresponding to the second conductive underlayer 25a), being another portion of the conductive underlayer M, and the fifth plating body X5 (corresponding to the fifth plating layer 25b) are laminated to the base film 3 are obtained. The etching uses an etching solution that erodes the metal forming the conductive underlayer M.
<Advantage>

According to the method of manufacturing the flexible printed circuit board 20, the flexible printed circuit board 20 described above can be manufactured. That is, the flexible printed circuit board 20 that can reduce the electrical resistance of the entirety of interconnects and achieve space-savings can be manufactured.

Other Embodiments

The embodiments disclosed herein should be considered to be examples in all respects and non-restrictive. The scope of the present invention is not limited to the configuration of the above-described embodiments. The scope of the present invention is set forth by the appended claims, and it is intended to include all modifications within the scope of the claims and equivalents.

In the above-described embodiments, a flexible printed circuit board including a single base film and multiple interconnects laminated to one side of the base film has been described, but the flexible printed circuit board may be a flexible printed circuit board in which multiple interconnects are laminated to both sides of the single base film. The flexible printed circuit board may also be a multi-layer printed circuit board including multiple base films each having multiple interconnects on either one side or both sides.

In the above-described embodiments, the case in which multiple interconnects multiple first include interconnects and multiple second interconnects has been described. However, the multiple interconnects may include a single first interconnect and a single second interconnect, may include a single first interconnect and multiple second interconnects, and may include multiple first interconnects and a single second interconnect.

In the above-described first embodiments, the case in which the thickness of the first plating layer 13b of the first interconnect 13 is the same as the thickness of the second plating layer 15b of the second interconnect has been described, but the thickness of the first plating layer 13b of the first interconnect 13 may differ from the thickness of the second plating layer 15b of the second interconnect.

In the above-described first embodiments, the case in which the line width of the second interconnect 15 is greater than the line width of the first interconnect 13 has been described. However, the line width of the second interconnect 15 may be the same as the line width of the first interconnect 13 or may be less than the line width of the first interconnect 13.

In the above-described first embodiments, the case in which the first conductive underlayer 13a and the first plating layer 13b of the first interconnect 13 are formed in the same shape has been described, but these shapes may be different. The case in which the second conductive underlayer 15a and the second plating layer 15b of the second interconnect 15 are formed in the same shape has been described, but these shapes may be different.

In the second plating step of the above-described first embodiment, the case in which the second resist pattern R2 masks all intervals between the second plating bodies X2 in addition to all intervals of the first plating bodies X1 has been described. However, the second resist pattern R2 may mask only all intervals of the first plating bodies X1 and mask no interval between the second plating bodies X2.

In the above-described second embodiment, the case in which the third conductive underlayer 23a and the fourth plating layer 23b of the first interconnect 23 are formed in the same shape has been described, but these shapes may be different. The case in which the fourth conductive underlayer 25a and the fifth plating layer 25b of the second interconnect 25 are formed in the same shape has been described, but these shapes may be different.

In the above-described first and second embodiments, the case in which the average line width of the second interconnect is greater than the average line width of the first interconnects has been described. However, the average line width of the second interconnect may be the same as the average line width of the first interconnects or may be less than the average line width of the first interconnects.

In the above-described first and second embodiments, the case in which the average interval of the second interconnects is the same as the average interval of the first interconnects has been described. However, the average interval of the second interconnects may be different from the average interval of the first interconnects.

INDUSTRIAL APPLICABILITY

The flexible printed circuit board according to the embodiments of the present disclosure, and the flexible printed circuit board manufactured by the method of manufacturing the flexible printed circuit board, can reduce the electrical resistance of the entirety of interconnects and also achieve space-savings. Therefore, the flexible printed circuit board is suitably used in, for example, small electronic devices.

What is claimed is:

1. A flexible printed circuit board comprising:
a base film having an insulating property; and
a plurality of interconnects laminated to at least one surface side of the base film,
wherein the plurality of interconnects includes a first interconnect and a second interconnect in a same plane, an average thickness of the second interconnect being greater than an average thickness of the first interconnect,
wherein a ratio of the average thickness of the second interconnect to the average thickness of the first interconnect is greater than or equal to 1.5 and less than or equal to 50,
wherein the first interconnect includes a first conductive underlayer and a first plating layer, and the second interconnect includes a second conductive underlayer, a second plating layer, and a third plating layer,
wherein a ratio of the average thickness of the first interconnect to a minimum line width of the first interconnect is greater than or equal to 0.3 and less than or equal to 5,
wherein a ratio of the average thickness of the second interconnect to a minimum line width of the second interconnect is greater than or equal to 0.5 and less than or equal to 10, and
wherein the third plating layer covers an upper surface and a side surface of the second plating layer, and a thickness of the third plating layer between an upper surface of the third plating layer and the upper surface of the second plating layer is greater than a thickness of the third plating layer between a side surface of the third plating layer and the side surface of the second plating layer.

2. The flexible printed circuit board as claimed in claim 1, comprising a plurality of said first interconnects, wherein an average line width of each of the first interconnects is greater than or equal to 3 μm and less than or equal to 100 μm, and an average interval of the first interconnects is greater than or equal to 3 μm and less than or equal to 100 μm.

3. The flexible printed circuit board as claimed in claim 1, comprising a plurality of said second interconnects, wherein an average line width of each of the second interconnects is greater than or equal to 5 μm and less than or equal to 100 μm, and an average interval of the second interconnects is greater than or equal to 5 μm and less than or equal to 100 μm.

4. The flexible printed circuit board as claimed in claim 1, wherein a ratio of a minimum cross-sectional area of the second interconnect in a thickness direction to a minimum cross-sectional area of the first interconnect in the thickness direction is greater than or equal to 0.5 and less than or equal to 200, the minimum cross-sectional area of the first interconnect in the thickness direction being calculated by multiplying the average thickness of the first interconnect by a minimum line width of the first interconnect, and the minimum cross-sectional area of the second interconnect in the thickness direction being calculated by multiplying the average thickness of the second interconnect by a minimum line width of the second interconnect.

5. The flexible printed circuit board as claimed in claim 1, wherein a line width of the third plating layer is greater than a line width of the second conductive underlayer and a line width of the second plating layer.

6. The flexible printed circuit board as claimed in claim 1, wherein the third plating layer is laminated to the one surface side of the base film and covers the second conductive underlayer and the second plating layer.

7. A method of manufacturing a flexible printed circuit board as claimed in claim 1, the method comprising:
forming one or more first plating bodies and one or more second plating bodies by electroplating a first metallic material on a conductive underlayer on the base film by using a first resist pattern,
removing the first resist pattern and non-laminated regions of the conductive underlayer where the one or more first plating bodies and the one or more second plating bodies are not laminated after the forming of the one or more first plating bodies and the one or more second plating bodies,
forming one or more third plating bodies by electroplating a second metallic material on the one or more second plating bodies by using a second resist pattern after the removing of the first resist pattern and the non-laminated regions of the conductive underlayer, and
removing the second resist pattern after the forming of the one or more third plating bodies,
so that the first interconnect is formed as a first laminated structure including the conductive underlayer and a corresponding one of the one or more first plating bodies, and the second interconnect is formed as a second laminated structure including the conductive underlayer, a corresponding one of the one or more second plating bodies, and a corresponding one of the one or more third plating bodies.

8. The flexible printed circuit board as claimed in claim 1, wherein a thickness of the first plating layer of the first interconnect is equal to a thickness of the second plating layer of the second interconnect.

\* \* \* \* \*